(12) United States Patent
Park et al.

(10) Patent No.: US 7,529,127 B2
(45) Date of Patent: May 5, 2009

(54) MEMORY DEVICE AND METHOD THEREOF

(75) Inventors: Dae-sik Park, Hwaseong-si (KR); Jin-yub Lee, Seoul (KR)

(73) Assignee: Samsung Electronics, Co., /Ltd, Gyeonggi-do (KR)

( * ) Notice: Subject to any disclaimer, the term of this patent is extended or adjusted under 35 U.S.C. 154(b) by 0 days.

(21) Appl. No.: 11/604,692

(22) Filed: Nov. 28, 2006

(65) Prior Publication Data
US 2008/0084768 A1    Apr. 10, 2008

(30) Foreign Application Priority Data
Sep. 29, 2006    (KR) .................. 10-2006-0096283

(51) Int. Cl.
*G11C 16/04* (2006.01)
(52) U.S. Cl. .................. 365/185.03; 365/185.17; 365/185.33
(58) Field of Classification Search ............ 365/185.03, 365/185.17, 185.33, 185.22; 711/103, 154, 711/167
See application file for complete search history.

(56) References Cited

U.S. PATENT DOCUMENTS

| | | | |
|---|---|---|---|
| 6,700,820 B2 | 3/2004 | Elmhurst et al. | |
| 6,965,964 B2 * | 11/2005 | Lee et al. | 711/103 |
| 7,301,825 B2 * | 11/2007 | Seong et al. | 365/185.03 |
| 2007/0030735 A1 * | 2/2007 | Crippa et al. | 365/185.12 |

FOREIGN PATENT DOCUMENTS

| | | |
|---|---|---|
| JP | 2000-040382 | 2/2000 |
| JP | 2002-025277 | 1/2002 |
| KR | 1020040090486 A | 10/2004 |

* cited by examiner

*Primary Examiner*—David Lam
(74) *Attorney, Agent, or Firm*—Harness, Dickey & Pierce, PLC

(57) ABSTRACT

A memory device and method thereof are provided. The memory device may comprise a first buffer for receiving most significant bit (MSB) data and least significant bit (LSB) data to be stored within a memory cell; a second buffer for loading LSB data stored in the memory cell; and a data loader for generating at least one load signal based upon logic levels of the received MSB data in the first buffer and the loaded LSB data in the second buffer, the at least one load signal being configured to control programming permissions for the memory cell.

28 Claims, 5 Drawing Sheets

| DATA (STATE) OF MEMORY CELL | THRESHOLD VOLTAGE OF MEMORY CELL | DATA TO BE WRITTEN OR READ | |
|---|---|---|---|
| | | MSB | LSB |
| 0 | 0V or LESS | 1 | 1 |
| 1 | 0.3V ~ 0.5V | 0 | 1 |
| 2 | 0.8V ~ 1.0V | 1 | 0 |
| 3 | 1.3V ~1.5V | 0 | 0 |

|  | FIRST BUFFER (MSB) | SECOND BUFFER (LSB) | LOAD0 |
|---|---|---|---|
| DATA | 0 | 0 | 0 |
|  | 0 | 1 | 1 |
|  | 1 | X | 1 |

|  | FIRST BUFFER (MSB) | SECOND BUFFER (LSB) | LOAD1 |
|---|---|---|---|
| DATA | 1 | 0 | 0 |
|  | 1 | 1 | 1 |
|  | 0 | X | 1 |

|  | FIRST BUFFER (MSB) | SECOND BUFFER (LSB) | LOAD2 |
|---|---|---|---|
| DATA | 0 | 1 | 0 |
|  | 0 | 0 | 1 |
|  | 1 | X | 1 |

MEMORY DEVICE AND METHOD THEREOF

PRIORITY STATEMENT

This application claims the benefit of Korean Patent Application No. 10-2006-0096283, filed on Sep. 29, 2006, in the Korean Intellectual Property Office, the disclosure of which is incorporated herein in its entirety by reference.

BACKGROUND OF THE INVENTION

1. Field of the Invention

Example embodiments of the present invention relate generally to a memory device and method thereof, and more particularly to a memory device and method of programming the memory device.

2. Description of the Related Art

A conventional multi-level cell (MLC) flash memory device may store a plurality of data in a single cell of NAND flash memory (e.g., based upon multiple threshold voltage level ranges, with each range associated with a different logic level or data state).

FIG. 1 is a table illustrating a relationship between memory cell data of a MLC flash memory and a threshold voltage of a memory cell. Referring to FIG. 1, data states "0"~"3" of the memory cell may be configured such that lower-valued data states are associated with lower threshold voltages and higher-valued data states are associated with higher threshold voltages. The data of a memory cell may enter into a state "0" due to an erasing operation and may move to a higher-level state corresponding to a higher threshold voltage of the memory cell due to a programming operation. If a memory cell stores 2 bits of data, the 2 bits may be divided into most significant bit (MSB) data and least significant bit (LSB) data.

FIG. 2 illustrates a conventional process of programming the MLC flash memory of FIG. 1. Referring to FIG. 2, during memory cell programming, LSB data may be first programmed, followed by a programming of MSB data. If programming data of MSB data or LSB data is set to a first logic level (e.g., a higher logic level or logic "1"), the threshold voltage of a memory cell may not be changed during a programming operation and the data thereof may not be changed. Alternatively, if programming data of MSB data or LSB data is set to a second logic level (e.g., a lower logic level or logic "0"), the threshold voltage of a memory cell may be changed during a programming operation and accordingly the data thereof may be changed.

Referring to FIG. 2, the respective states "0" ~"3" may be characterized by State "0": MSB="1", LSB="1"
State "1": MSB="0", LSB="1"
State "2": MSB="1", LSB="0"
State "3": MSB="0", LSB="0"

Referring to FIG. 2, a transition between states will now be described. For example, if the memory cell is erased or at state "0", the memory cell may transition to state "2" if LSB data transitions from the first logic level (e.g., a higher logic level or logic "1") to the second logic level (e.g., a lower logic level or logic "0") during a programming operation. In another example, if the memory cell is at state "1", the memory cell may transition to state "3" if LSB data transitions from the first logic level to the second logic level during a programming operation.

Referring to FIG. 2, if the memory cell is at state "2", the memory cell may transition to state "3" if MSB data transitions from the first logic level (e.g., a higher logic level or logic "1") to the second logic level (e.g., a lower logic level or logic "0") during a programming operation. Alternatively, if the memory cell is at state "0", the memory cell may transition to state "1" if MSB data transitions from the first logic level to the second logic level during a programming operation.

Referring to FIG. 2, during a read operation, LSB data may be read out, following by reading out MSB data. If the LSB data is read out while the memory cell is at either of states "0" or "1", the LSB data may be "1". Alternatively, if the LSB data is read out while the memory cell is at either of states "2" or "3", the LSB data may be "0". Thus, a logic level of LSB data may be sufficient to determine whether the memory cell is at one of states "0" and "1" or at one of states "2" and "3".

Referring to FIG. 2, during a read operation, if the MSB data is read out while the memory cell is at either of states "0" or "2", the MSB data may be "1". Alternatively, if the MSB data is read out while the memory cell is at either of states "1" or "3", the MSB data may be "0".

Accordingly, it will be appreciated that three (3) operations may be required, based upon the read MSB and LSB data, to determine state-specific information of the memory cell, such as whether the memory cell is at state "0" or a greater state, whether the memory cell is at a state less than or equal to state "1", whether the memory cell is at a state less than or equal to state "2", and/or whether the memory cell may have a state less than or equal to state "2" or a state "3", etc.

Accordingly, in a conventional process of programming an MLC flash memory device, a higher number of operations may be performed to read out data from a memory cell, which may thereby increase a programming time.

SUMMARY OF THE INVENTION

An example embodiment of the present invention is directed to a memory device, including a first buffer receiving most significant bit (MSB) data and least significant bit (LSB) data to be stored within a memory cell, a second buffer loading stored LSB data stored from the memory cell and a data loader generating at least one load signal based upon logic levels of the received MSB data from the first buffer and the loaded LSB data from the memory cell, the at least one load signal controlling programming permissions for the memory cell.

Another example embodiment of the present invention is directed to a method of programming a memory device, including receiving LSB data, storing the received LSB data within a memory cell, receiving MSB data, loading the LSB data from the programmed memory cell, generating at least one load signal based upon logic levels of the received MSB data and the loaded LSB data, the at least one load signal controlling programming permissions for the memory cell and storing the MSB data within the memory cell based on the at least one load signal.

Another example embodiment of the present invention is directed to a multi-level cell (MLC) flash memory device capable of reducing the time required for programming.

Another example embodiment of the present invention is directed to a method of programming the MLC flash memory device.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figures 1, 2:
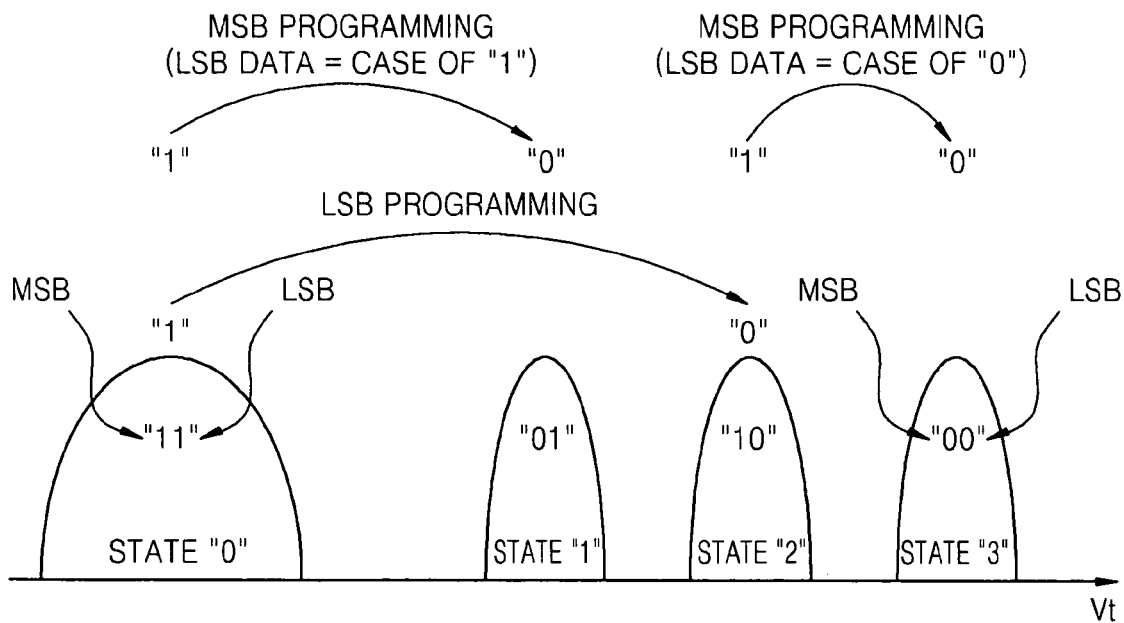
FIG. 1 is a table illustrating a relationship between memory cell data of a multi-level cell (MLC) flash memory and a threshold voltage of a memory cell.
FIG. 2 illustrates a conventional process of programming the MLC flash memory of FIG. 1.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
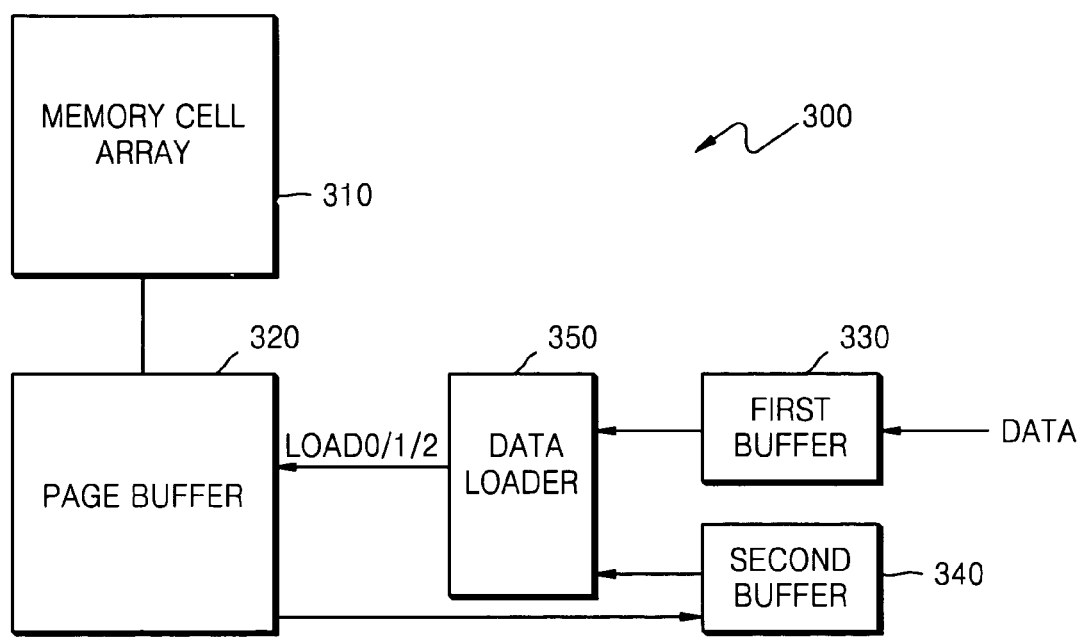
FIG. 3 is a block diagram of a multi-level cell (MLC) flash memory device according to an example embodiment of the present invention.

FIG. 3 is a block diagram of a multi-level cell (MLC) flash memory device 300 according to an example embodiment of the present invention. In the example embodiment of FIG. 3, the MLC flash memory device 300 may include a memory cell array 310, a page buffer 320, first and second buffers 330 and 340 and a data loader 350.

In the example embodiment of FIG. 3, the memory cell array 310 may include a plurality of bit lines, a plurality of word lines, a plurality of common source lines and a matrix arrangement of electrically data programmable memory cells. In an example, the memory cell array 310 may be an arrangement of a plurality of NAND cells. The memory cell array 310 may be divided into blocks, with each block including, for example, a plurality of NAND cells (e.g., 4223 NAND cells). Data of the memory cell array 310 may be erased on a block-by-block basis. Memory cells connected to one word line constitute one sector, and data writing and reading may be performed on a sector-by-sector basis. In an example, each sector may store 2 pages of data.

In the example embodiment of FIG. 3, the page buffer 320 may buffer external data and may transmit the buffered external data to the memory cells. The page buffer 320 may include registers made up of latches. The page buffer 320 may buffer the LSB data, which is described with respect to conventional FIGS. 1 and 2.

Figure 4:
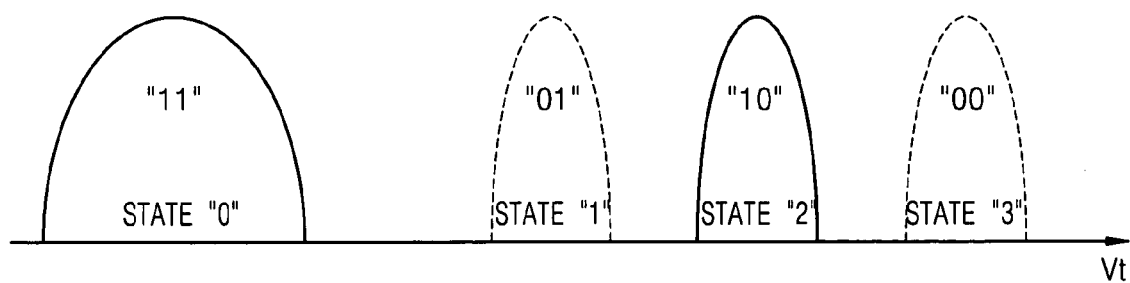
FIG. 4 illustrates data states and associated threshold voltages according to another example embodiment of the present invention.

In the example embodiment of FIG. 3, the first buffer 330 may receive LSB data and MSB data. The first buffer 330 may receive the LSB data and may transmit the LSB data to the page buffer 320. Based upon whether the LSB data transmitted to the page buffer 320 is set to a first logic level (e.g., a higher logic level or logic "1") or a second logic level (e.g., a lower logic level or logic "0"), the memory cells of the memory cell array 310 may be programmed into a state "0" or "2" (e.g., under the assumption that the MSB data may initially be set to the first logic level or logic "1"), as illustrated in the example embodiment of FIG. 4. FIG. 4 illustrates data states and associated threshold voltages according to another example embodiment of the present invention. The second buffer 340 may receive the LSB data read from the memory cells by the page buffer 320.

Figures 5, 6:
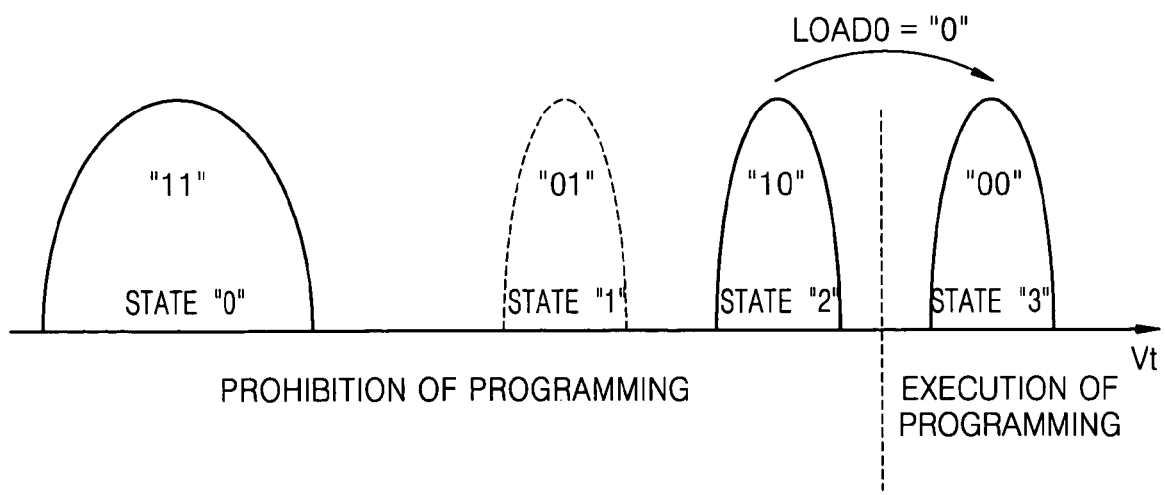
FIG. 5 illustrates tables of logic conditions for a data loader according to another example embodiment of the present invention.
FIG. 6 illustrates programming permissions based upon a logic level of a first load signal according to another example embodiment of the present invention.

FIG. 5 illustrates tables of logic conditions for the data loader 350 of FIG. 3 according to another example embodiment of the present invention. As illustrated in the example embodiment of FIG. 5, the data loader 350 may generate first, second and third load signals LOAD0, LOAD1, and LOAD2, respectively, based on a logic status of LSB data, stored in the second buffer 340, and MSB data, stored in the first buffer 330. The first, second, and third load signals LOAD0, LOAD1, and LOAD2 may be used to program the MSB data and the LSB data with a reduced number of comparison or determining operations (e.g., less than 3 as in the conventional art), as will now be described in greater detail.

FIG. 6 illustrates programming permissions based upon a logic level of the first load signal LOAD0 according to another example embodiment of the present invention.

In the example embodiment of FIG. 6, if the LSB data is set to the second logic level (e.g., a lower logic level or logic "0"), the first load signal LOAD0 may be set to the second logic level if the MSB data is set to the second logic level, and the first load signal LOAD0 may alternatively be set to the first logic level (e.g., a higher logic level or logic "1") if the MSB data is set to the first logic level. If the LSB data is set to the first logic level, the first load signal LOAD0 may be set to the first logic level irrespective of a logic setting of the MSB data. If the first load signal LOAD0 is set to the second logic level (e.g., a lower logic level or logic "0"), programming may be performed. Alternatively, if the first load signal LOAD0 is set to the first logic level, programming may not be performed.

Figure 7:
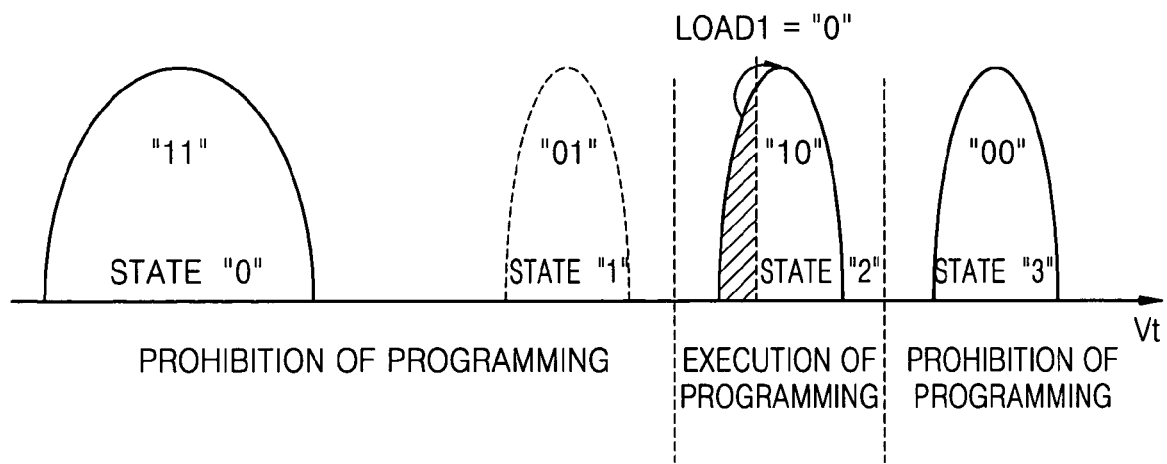
FIG. 7 illustrates programming permissions based upon a logic level of a second load signal according to another example embodiment of the present invention.

FIG. 7 illustrates programming permissions based upon a logic level of the second load signal LOAD1 according to another example embodiment of the present invention.

In the example embodiment of FIG. 7, if the LSB data is set to the second logic level (e.g., a lower logic level or logic "0"), the second load signal LOAD1 may be set to the first logic level (e.g., a higher logic level or logic "1") if the MSB data is set to the second logic level, and the second load signal LOAD1 may alternatively be set to the second logic level if the MSB data is set to the first logic level. If the LSB data is set to the first logic level, the second load signal LOAD1 may be set to the first logic level irrespective of a logic setting of the MSB data. If the second load signal LOAD1 is set to the second logic level (e.g., a lower logic level or logic "0"), programming may be performed. Alternatively, if the second load signal LOAD1 is set to the first logic level, programming may not be performed.

Figure 8:
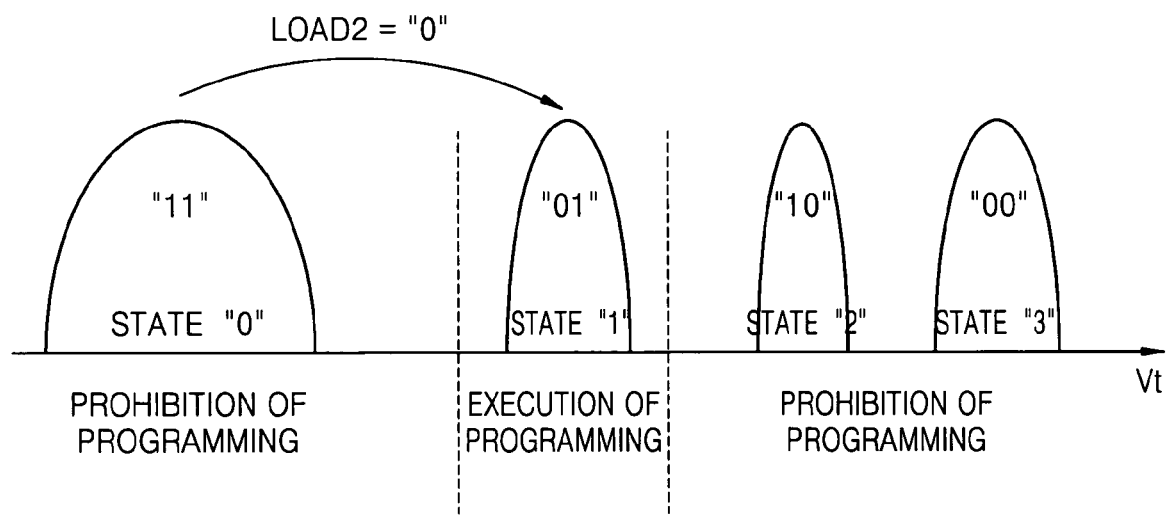
FIG. 8 illustrates programming permissions based upon a logic level of a third load signal according to another example embodiment of the present invention.

FIG. 8 illustrates programming permissions based upon a logic level of the third load signal LOAD2 according to another example embodiment of the present invention.

In the example embodiment of FIG. 8, if the LSB data is set to the second logic level (e.g., a lower logic level or logic "0"), the third load signal LOAD2 may be set to the first logic level (e.g., a higher logic level or logic "1") irrespective of a logic setting of the MSB data. If the LSB data is set to the first logic level, the third load signal LOAD2 may be set to the second logic level if the MSB data is set to the second logic level, and may alternatively be set to the first logic level if the MSB data is set to the first logic level. If the third load signal LOAD2 is set to the second logic level (e.g., a lower logic level or logic "0"), programming may be performed. Alternatively, if the third load signal LOAD2 is set to the first logic level, programming may not be performed.

Figure 9:
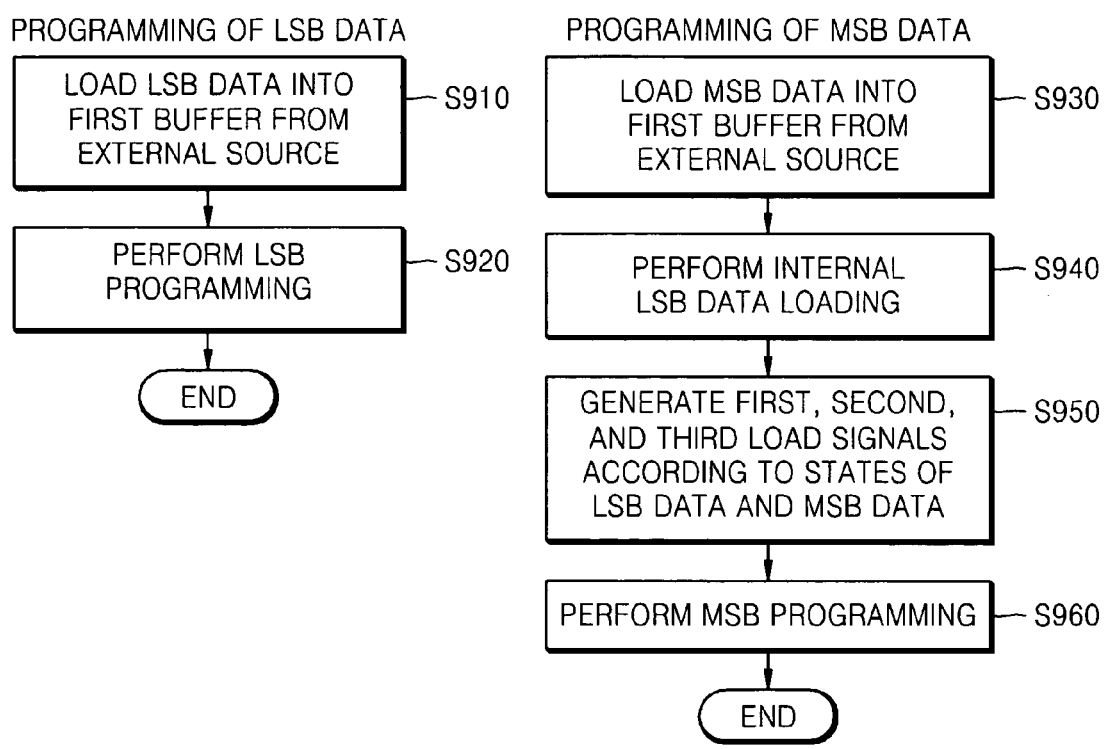
FIG. 9 is a flowchart illustrating a process of programming the MLC flash memory device of FIG. 3 according to another example embodiment of the present invention.

FIG. 9 is a flowchart illustrating a process of programming the MLC flash memory device 300 of FIG. 3 according to another example embodiment of the present invention.

In the example embodiment of FIG. 9, LSB data may be received at the first buffer 330 (e.g., from an external source) (at S910) and LSB data programming may be performed (e.g., the received LSB data may be stored within a given memory cell of the memory cell array 310) (at S920). Further, MSB data may be received at the first buffer 330 (e.g., from an external source) (at S930) and the stored LSB data loading may be loaded (e.g., into the second buffer 340) (at S940) in order to generate first, second and third load signals LOAD0, LOAD1 and LOAD2 based upon logic levels of the loaded LSB data and the received MSB data (at S950). After the first, second and/or third load signals LOAD0, LOAD1 and LOAD2 are generated, MSB data programming may be performed (at S960).

In another example embodiment of the present invention, a process of programming MSB data and LSB data (e.g., with an MLC flash memory device) may include a reduced number of operations as compared to the conventional art.

Example embodiments of the present invention being thus described, it will be obvious that the same may be varied in many ways. For example, it is understood that the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention.

Further, while four threshold ranges signifying four data states are described above, it is understood that other example embodiments of the present invention may be directed to a multi-level cell (MLC) flash memory device including any number of data states and associated voltage threshold ranges.

Further, while above-described example embodiments of the present invention are related to MLC flash memory devices, it is understood that other example embodiments of the present invention may be directed to any well-known type of memory device.

Such variations are not to be regarded as a departure from the spirit and scope of example embodiments of the present invention, and all such modifications as would be obvious to one skilled in the art are intended to be included within the scope of the following claims.

What is claimed is:

1. A memory device, comprising:
 a first buffer configured to receive most significant bit (MSB) data and least significant bit (LSB) data to be stored within a memory cell;
 a second buffer configured to load LSB data stored in the memory cell; and
 a data loader configured to generate at least one load signal based upon logic levels of the received MSB data in the first buffer and the loaded LSB data in the second buffer, the at least one load signal being configured to control programming permissions for the memory cell.

2. The memory device of claim 1, wherein the memory cell is a multi-level memory cell configured to be set to one of a plurality of data states, each data state associated with a different threshold voltage range and with different values for the stored LSB and MSB data.

3. The memory device of claim 1, wherein the memory device is a multi-level cell (MLC) flash memory device.

4. The memory device of claim 1, wherein the at least one load signal includes first, second and third load signals.

5. The memory device of claim 4, wherein the data loader is configured to set the first load signal to a first logic level if the loaded LSB data is set to a second logic level and the received MSB data is set to the first logic level, and the data loader is configured to set the first load signal to the second logic level if the loaded LSB data is set to the second logic level and the received MSB data is set to the second logic level.

6. The memory device of claim 5, wherein the data loader is configured to set the first load signal to the first logic level irrespective of the received MSB data if the loaded LSB data is set to a first logic level.

7. The memory device of claim 5, wherein the first load signal is configured to instructs the stored MSB data to transition from the first logic level to the second logic level.

8. The memory device of claim 4, wherein the data loader is configured to set the second load signal to a first logic level if the loaded LSB data is set to a second logic level and the received MSB data is set to the second logic level, and the data loader is configured to set the second load signal to the second logic level if the loaded LSB data is set to the second logic level and the received MSB data is set to the first logic level.

9. The memory device of claim 8, wherein the data loader is configured to sets the second load signal to the first logic level if the loaded LSB data is set to the first logic level.

10. The memory device of claim 8, wherein the second load signal is configured to instructs the stored MSB data to transition to the first logic level and the stored LSB data to transition to the second logic level.

11. The memory device of claim 4, wherein the data loader is configured to set the third load signal to a first logic level if the loaded LSB data is set to the first logic level and the received MSB data is set to the first logic level, and the data loader is configured to set the third load signal to the second logic level if the loaded LSB data is set to the first logic level and the received MSB data is set to the second logic level.

12. The memory device of claim 11, wherein the data loader is configured to set the third load signal to the first logic level if the loaded LSB data is set to the second logic level.

13. The memory device of claim 11, wherein the third load signal is configured to instructs the stored LSB data to transition to the first logic level and the stored MSB data to transition to the second logic level.

14. The memory device of claim 4, wherein the memory device is configured so that programming operations for the memory cell are prohibited if at least one of the first, second and third load signals is set to a first logic level.

15. A method of programming a memory device, comprising:
receiving least significant bit (LSB) data;
storing the received LSB data within a memory cell;
receiving most significant bit (MSB) data;
loading the LSB data from the programmed memory cell;
generating at least one load signal based upon logic levels of the received MSB data and the loaded LSB data, the at least one load signal controlling programming permissions for the memory cell; and
storing the MSB data within the memory cell based on the at least one load signal.

16. The method of claim 15, wherein the memory cell is a multi-level cell memory cell configured to be set to one of a plurality of data states, each data state associated with a different threshold voltage range and with different values for the stored LSB and MSB data.

17. The method of claim 15, wherein the memory device is a multi-level cell (MLC) flash memory device.

18. The method of claim 15, wherein the at least one load signal includes first, second and third load signals.

19. The method of claim 18, wherein the first load signal is set to a first logic level if the loaded LSB data is set to a second logic level and the received MSB data is set to the first logic level, and the first load signal is set to the second logic level if the loaded LSB data is set to the second logic level and the received MSB data is set to the second logic level.

20. The method of claim 19, wherein if the loaded LSB data is set to a first logic level, the first load signal is set to the first logic level irrespective of the received MSB data.

21. The method of claim 19, wherein the first load signal instructs the stored MSB data to transition from the first logic level to the second logic level.

22. The method of claim 18, wherein the second load signal is set to a first logic level if the loaded LSB data is set to a second logic level and the received MSB data is set to the second logic level, and the second load signal is set to the second logic level if the loaded LSB data is set to the second logic level and the received MSB data is set to the first logic level.

23. The method of claim 22, wherein the second load signal is set to the first logic level if the loaded LSB data is set to the first logic level.

24. The method of claim 22, wherein the second load signal instructs the stored MSB data to transition to the first logic level and the stored LSB data to transition to the second logic level.

25. The method of claim 18, wherein the third load signal is set to a first logic level if the loaded LSB data is set to the first logic level and the received MSB data is set to the first logic level, and the third load signal is set to the second logic level if the loaded LSB data is set to the first logic level and the received MSB data is set to the second logic level.

26. The method of claim 25, wherein the third load signal is set to the first logic level if the loaded LSB data is set to the second logic level.

27. The method of claim 25, wherein the third load signal instructs the stored LSB data to transition to the first logic level and the stored MSB data to transition to the second logic level.

28. The method of claim 18, wherein programming operations for the memory cell are prohibited if at least one of the first, second and third load signals is set to a first logic level.

* * * * *